(12) United States Patent
Terao et al.

(10) Patent No.: US 7,923,201 B2
(45) Date of Patent: Apr. 12, 2011

(54) NEAR-FIELD EXPOSURE METHOD

(75) Inventors: Akira Terao, Yokohama (JP); Toshiki Ito, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 533 days.

(21) Appl. No.: 12/048,767

(22) Filed: Mar. 14, 2008

(65) Prior Publication Data

US 2008/0248432 A1 Oct. 9, 2008

(30) Foreign Application Priority Data

Mar. 15, 2007 (JP) ................................. 2007-066187

(51) Int. Cl.
*G03F 7/20* (2006.01)
(52) U.S. Cl. ........................................... 430/322; 430/5
(58) Field of Classification Search .................. 430/322, 430/5, 323
See application file for complete search history.

(56) References Cited

U.S. PATENT DOCUMENTS

| | | | |
|---|---|---|---|
| 7,317,197 B2 | 1/2008 | Inao et al. ..................... 250/548 |
| 2006/0003233 A1* | 1/2006 | Yamaguchi et al. .............. 430/5 |
| 2006/0003269 A1 | 1/2006 | Ito et al. ......................... 430/323 |
| 2006/0014108 A1 | 1/2006 | Ito et al. ......................... 430/322 |
| 2006/0110693 A1* | 5/2006 | Kuroda et al. ................. 430/394 |
| 2008/0079926 A1 | 4/2008 | Ito et al. ........................... 355/73 |
| 2008/0085474 A1 | 4/2008 | Mizutani et al. .............. 430/322 |
| 2008/0107998 A1 | 5/2008 | Inao et al. ..................... 430/322 |

FOREIGN PATENT DOCUMENTS

JP 2004-335752 11/2004

OTHER PUBLICATIONS

Toshiki Ito, et al., "Fabrication of Half-Pitch 32 nm Resist Patterns Using Near-Field Lithography with a-Si Mask," Applied Physics Letters, Jul. 2006, vol. 89, pp. 033113-1-033113-3.

* cited by examiner

*Primary Examiner* — Kathleen Duda
*Assistant Examiner* — Caleen O Sullivan
(74) *Attorney, Agent, or Firm* — Fitzpatrick, Cella, Harper & Scinto (57) ABSTRACT

A near-field exposure method in which an exposure mask having a light blocking film with an opening smaller than a wavelength of light from an exposure light source is used, and an object is exposed by near-field light produced at the opening of the exposure mask based on the exposure light from the exposure light source. A width of the opening is determined to satisfy equations (1), (2) and (3) below, wherein the width of the opening of the exposure mask is denoted by s (nm), a processing pitch of the object to be exposed is denoted by p (nm) and coefficients are denoted by a and b:

$$s = ap - b \qquad (1)$$

$$0.46 \leq a \leq 0.58 \qquad (2)$$

$$3 \leq b \leq 13 \qquad (3)$$

The exposure mask having the opening with the determined width is provided, and the exposure light is projected to the exposure mask to thereby expose the object to be exposed.

4 Claims, 7 Drawing Sheets

NEAR-FIELD EXPOSURE METHOD

This application claims priority from Japanese Patent Application No. 2007-066817, filed Mar. 15, 2007, which is hereby incorporated by reference herein.

FIELD OF THE INVENTION AND RELATED ART

This invention relates to a near-field exposure method and, more particularly, to a near-field exposure method, in which an exposure mask, comprising a light blocking film having micro openings smaller than the wavelength of light from an exposure light source, is used, and in which an object to be exposed is exposed by near-field light produced at the openings of the exposure mask by the exposure light from the exposure light source.

In recent years, in the fields of various electronic devices, including semiconductor devices, which need microprocessing, higher densification and integration of the devices have been urgently required, and, thus, further miniaturization of patterns is indispensable to satisfy these requirements.

Projection-system exposure apparatuses are used dominantly in recent years, satisfying these requirements. The projection-system exposure apparatus is generally comprised of a light source, an illumination optical system, a mask having a pattern formed thereon, a projection optical system and a stage for scanningly moving an object to be exposed. The resolution limit is about the wavelength of the light.

In this respect, proposals have been made for liquid-immersion exposure technology wherein a projection optical system and an object to be exposed are immersed in a liquid, and exposure is carried out based on this, to improve the resolution. However, this involves inconveniences of increased cost due to enlargement of the size of the projection optical system, as well as higher accuracy and complexity of the system.

On the other hand, as one of the inexpensive microprocessing methods in which the resolution does not depend on the wavelength of the light, there has been proposed a near-field exposure method using near-field light produced at micro openings formed in a light blocking film on the surface of an exposure mask.

Generally, since the intensity of near-field light is attenuated steeply with the distance from the micro openings, practically, it is necessary to place the micro openings and the object to be exposed close to each other, at a distance of 100 nm or less. Furthermore, it is known that the intensity of near-field light changes with the thickness of the light blocking film on the exposure mask surface, or the pitch or opening width of the micro openings.

Therefore, for precision exposure of a resist with a pattern using the near-field light, it is very important to control the distribution of the near-field light to be produced adjacent to the micro openings, based on the light blocking film on the exposure mask or the dimensions of the micro openings.

For control of such a near-field light distribution, Japanese Laid-Open Patent Application No. 2004-335752 has proposed a method wherein the thickness of the light blocking film on the exposure mask plane is particularly taken into consideration.

More particularly, in this proposal, the relationship among the thickness of the light blocking film, the opening width of the micro openings and the intensity of the near-field light is specified, and the thickness of the light blocking film is so selected to ensure that a desired near-field optical intensity is obtained.

Furthermore, in "Applied Physics Letters" 89, 033113 (2006), there is a report that the resist layer thickness is optimized based on the contrast of the near-field light distribution produced adjacent to the micro openings in the resist.

However, in these examples, although the relationship regarding the intensity or contrast of the near-field light is specified, the spatial distribution of the near-field light intensity, particularly, the intensity gradient of the near-field light adapted for 1:1 unit magnification exposure is not clarified.

Particularly, for accurate and efficient exposure of a resist with a micro-opening pattern formed on an exposure mask, how to determine the spatial distribution of the near-field light intensity is a critical issue.

SUMMARY OF THE INVENTION

The present invention, in one aspect thereof, provides a near-field exposure method wherein an exposure mask, having a light blocking film with an opening smaller than a wavelength of light from an exposure light source, is used and wherein an object to be exposed is exposed by near-field light produced at the opening of the exposure mask based on the exposure light from the exposure light source. The method comprises a step of determining a width of the opening so as to satisfy equations (1), (2) and (3) below, where the width of the opening of the exposure mask is denoted by s (nm), a processing pitch of the object to be exposed is denoted by p (nm) and coefficients are denoted by a and b, $$s = ap - b \quad (1)$$

$$0.46 \leq a \leq 0.58 \quad (2)$$

$$3 \leq b \leq 13 \quad (3)$$

a step of preparing the exposure mask having the opening with the width determined in the determining step, and a step of projecting the exposure light to the exposure mask to thereby expose the object to be exposed.

In one preferred form of this aspect of the present invention, the object to be exposed has a structure comprised of a substrate having a high reflectivity to the exposure light and a resist layer, and wherein the resist layer has a thickness not less than 120 nm and not greater than 150 nm.

The resist layer may have a multilayer resist structure comprised of at least an upper-layer resist layer and a lower-layer resist layer, and the upper-layer resist lay may have a thickness not less than 5 nm and not greater than 15 nm.

The method may further comprise a developing step as a post-process, after the exposure light projecting step, wherein, after the developing step, while the upper-layer resist layer remaining there may be used as a mask, a backing layer formed as a backing for the upper-layer resist layer is etched and, then, the lower-layer resist layer may be etched, while the etched backing layer is used as a mask.

In accordance with the present invention, a near-field exposure method is realized, by which a pattern of the micro openings formed on an exposure mask can be lithographically transferred to an object to be exposed, very precisely and efficiently, in 1:1 unit-magnification exposure.

These and other objects, features and advantages of the present invention will become more apparent upon a consideration of the following description of the preferred embodiments of the present invention, taken in conjunction with the accompanying drawings.

DESCRIPTION OF THE PREFERRED EMBODIMENTS

In accordance with the near-field exposure method based on the structure described above, a pattern of micro openings formed on an exposure mask can be lithographically transferred to an object to be exposed, very accurately and efficiently, in 1:1 unit-magnification exposure. This is based on the findings as follows, made by the inventors of the subject application.

More specifically, the inventors have found that the near-field light on the object to be exposed has a largest intensity gradient at a distance corresponding to ¼ of the processing pitch, from the center of the micro opening formed on the light blocking film of the exposure mask.

Hence, the present invention has been made on the basis of the finding, based on the above, that, with the largest intensity gradient of the near-field light, the difference in the dose amount at the boundary between an exposure portion and an unexposed portion of the object to be exposed becomes largest, and that the dose amount control (dose control) is, therefore, easy to do, and 1:1 unit-magnification exposure having good linewidth uniformity and high rectangularity can be achieved.

Next, preferred embodiments of a near-field exposure method according to the present invention will be described, with reference to the attached drawings.

Figure 1:
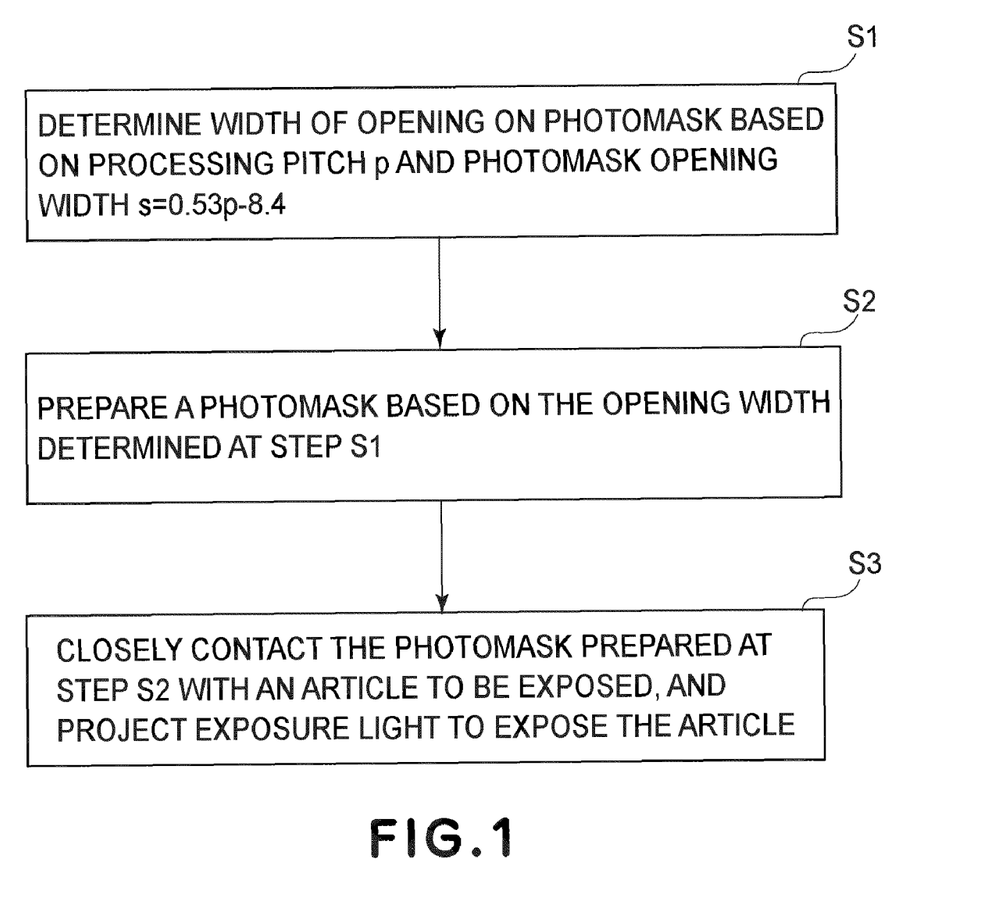
FIG. 1 is a flow chart for explaining a near-field exposure method according to an embodiment of the present invention.
Figure 2:
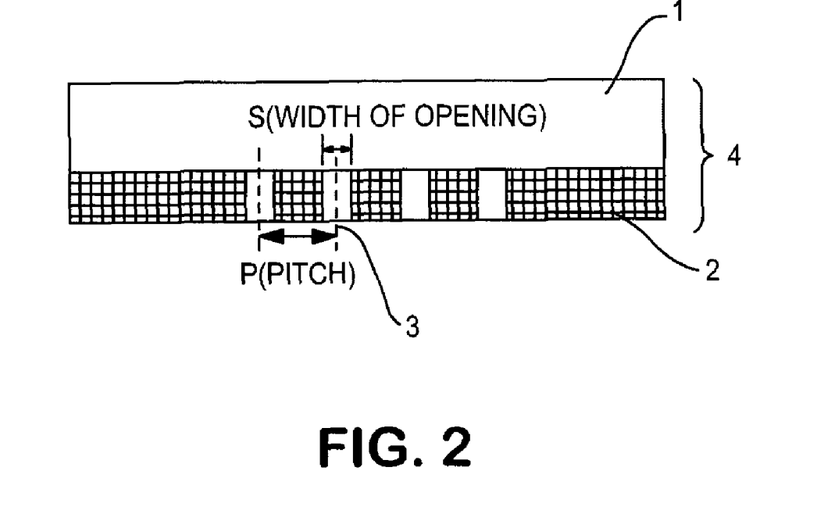
FIG. 2 is a diagram for explaining an exposure mask to be used in a near-field exposure method according to an embodiment of the present invention.

FIG. 1 is a flow chart for explaining a near-field exposure method according to an embodiment of the present invention. FIG. 2 is a diagram for explaining an exposure mask to be used in the near-field exposure method of the present embodiment.

Denoted in FIG. 2 at 1 is a mask base material, and denoted at 2 is a light blocking film. Denoted at 3 is a micro-opening pattern defined by micro openings formed on the exposure mask. Denoted at s (nm) is the width of opening of the micro openings of the exposure mask, and denoted at p (nm) is the pitch of the opening pattern (processing pitch of the object to be exposed).

In the present embodiment, the wavelength of the exposure light is 36.5 nm. The exposure mask has a structure shown in FIG. 2. This exposure mask comprises a light blocking film having openings smaller than the wavelength of the light of the exposure light source.

In the near-field exposure method of the present embodiment, through the following processes, the object to be exposed is exposed by near-field light produced by the exposure light from the exposure light source at the openings of the exposure mask. First of all, at step S1, when p (nm) is the processing pitch for processing the object to be exposed and s (nm) is the width of an opening of the micro-opening pattern on the light blocking film of the photomask, the width of an opening of the light blocking film to be formed on the exposure mask is determined to satisfy Equation (A), as follows. Here, the processing pitch for processing the object to be exposed is the same as the pitch of the minute-opening pattern.

$$s = 0.53p - 8.3 \quad (A)$$

Subsequently, at step S2, a photomask having an opening width as determined by the step S1 is manufactured.

Step S3 is a process for projecting exposure light while the photomask and the surface of the object to be exposed are closely contacted with each other, thereby to expose the object to be exposed.

Next, the near-field exposure performed in the present embodiment will be explained in detail with reference to FIG. 2.

The photomask 4 is comprised of a mask base material 1, a light blocking film 2 and a micro-opening pattern 3, for generating near-field light. The pitch of the micro-opening pattern 3 is the same as the desired processing pitch for processing the object to be exposed, as described above. Preferably, it should be approximately 200 nm or less.

The material of the mask base material 1 is silicon nitride, and the thickness thereof is around 500 nm. The material of the light blocking film 2 is amorphous silicon, and the thickness thereof is around 50 nm.

Next, the object to be exposed, used in the present embodiment, will be explained.

Figure 3:
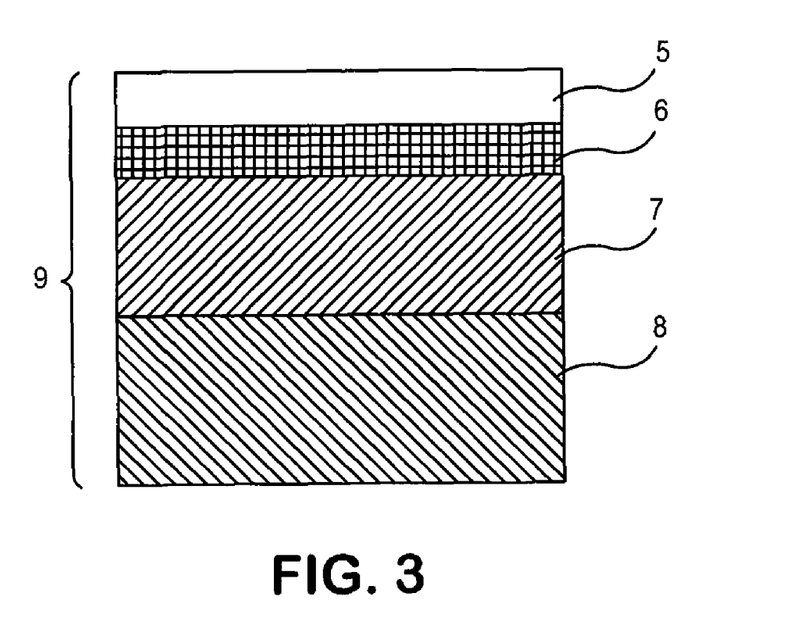
FIG. 3 is a diagram for explaining a general structure of an object to be exposed, used in an embodiment of the present invention.

FIG. 3 shows a general structure of the objected to be exposed, used in the present embodiment.

The object 9 to be exposed is comprised of a multilayer structure comprising a multilayered resist layer including an upper-layer resist layer 5, an SOG layer 6 and a lower-layer resist layer 7, as well as a substrate 8.

The upper-layer resist layer 5 is a layer, which is exposed by the exposure wavelength, and subsequently patterned in the development step.

With regard to the thickness of these layers, approximately, the upper-layer resist layer 5 is 10 nm, the SOG layer 6 is 20 nm, the lower-layer resist layer 7 is 100 nm, and the substrate 8 is 500 µm.

The upper-layer resist layer 5 and the lower-layer resist layer 7 are generally made of a resin series material, while the substrate 8 is made of silicon.

Next, the outline of the near-field exposure method in the present embodiment will be explained.

Figure 4:
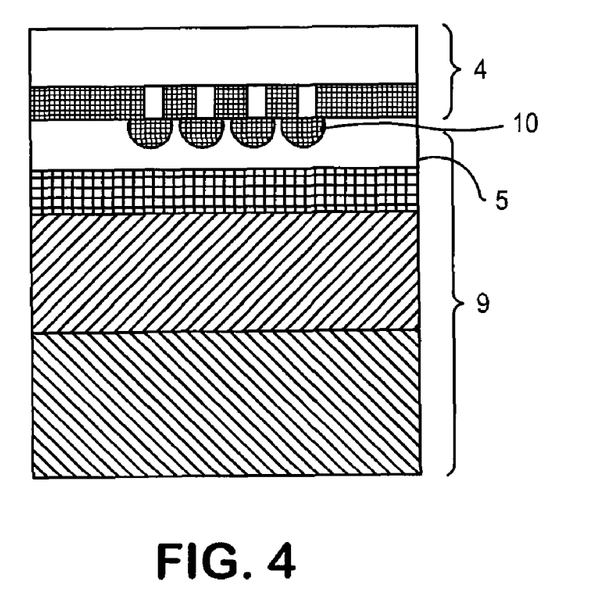
FIG. 4 is a diagram for explaining the outline of near-field exposure in an embodiment of the present invention.

FIG. 4 is a diagram for explaining the outline of the near-field exposure in the present embodiment.

In the near-field exposure, exposure light is projected to the photomask 4 after the photomask 4 and the upper-layer resist layer 5 of the object to be exposed 9 are closely contacted to each other, such that the upper-layer resist layer 5 is exposed by the near-field light 10 produced adjacent to the micro-opening pattern 3.

More specifically, of the upper-layer resist layer 5, the space in which the intensity of the near-field light is relatively high becomes an exposed portion, while the space in which the intensity is relatively low becomes an unexposed portion.

Here, it is known that the intensity of the near-field light 10 or the spatial distribution thereof changes complicatedly, depending on the pitch or width of the opening of opening pattern 3 or, alternatively, the thickness or material of the layered structures of the object 9 to be exposed.

Furthermore, as a technique for predicting the intensity of the near-field light or the spatial distribution thereof, an electromagnetic field analytical method based on an FDTD method (Finite Difference Time Domain Method) is known.

The inventors of the subject application applied the FDTD method to the near-field exposure method shown in FIG. 4, and succeeded in predicting the intensity or spatial distribution of the near-field light 10.

Figure 5:
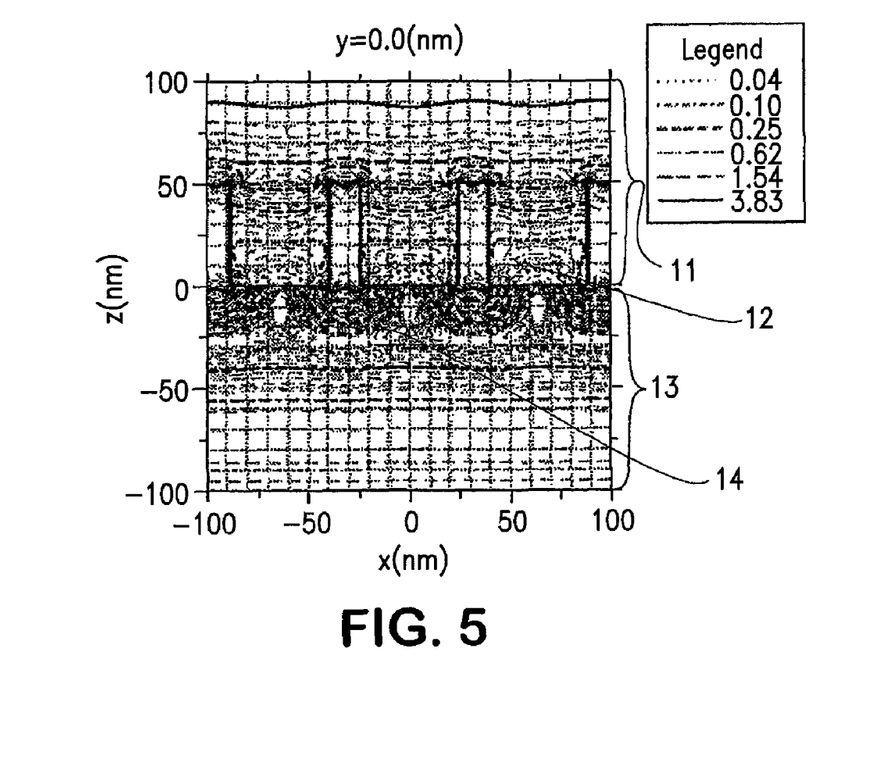
FIG. 5 is a diagram for explaining an example of a near-field light intensity distribution adjacent to a micro-opening pattern.

FIG. 5 shows an example of the intensity of near-field light adjacent to the close-contact interface between the photomask 4 and the object 9 to be exposed of FIG. 4, which is obtainable in accordance with the FDTD method.

In FIG. 5, a direction that is perpendicular to the photomask 4 is depicted conveniently as Z, and a horizontal direction is depicted as X. The spatial distribution of the intensity of the near-field light is illustrated by isointensity lines 14.

Next, the condition for producing a 1:1 micro surface-step pattern, such as a line-and-space pattern, for example, on the upper-layer resist layer 5 of the object 9 to be exposed, will be explained.

Here, a position that is at a distance of ¼ of the pitch of the micro-opening pattern 3 from the opening center of one micro opening, of the micro-opening pattern 3, and in the X direction, and which is at the Z-direction position corresponding to the boundary between the upper-layer resist layer 5 and the SOG layer 6 of the object 9 to be exposed, is specifically considered.

The position described above corresponds to the boundary, in the 1:1 line-and-space pattern, between the exposed portion and the unexposed portion of the upper-layer resist layer 5.

With the largest intensity gradient of the near-field light in the X-direction at the boundary between the exposed portion and the unexposed portion of the upper-layer resist layer 5, the difference in the dose amount after the exposure light is irradiated for a predetermined time becomes largest, such that a 1:1 line and space pattern can be produced with a good linewidth precision.

Figure 6:
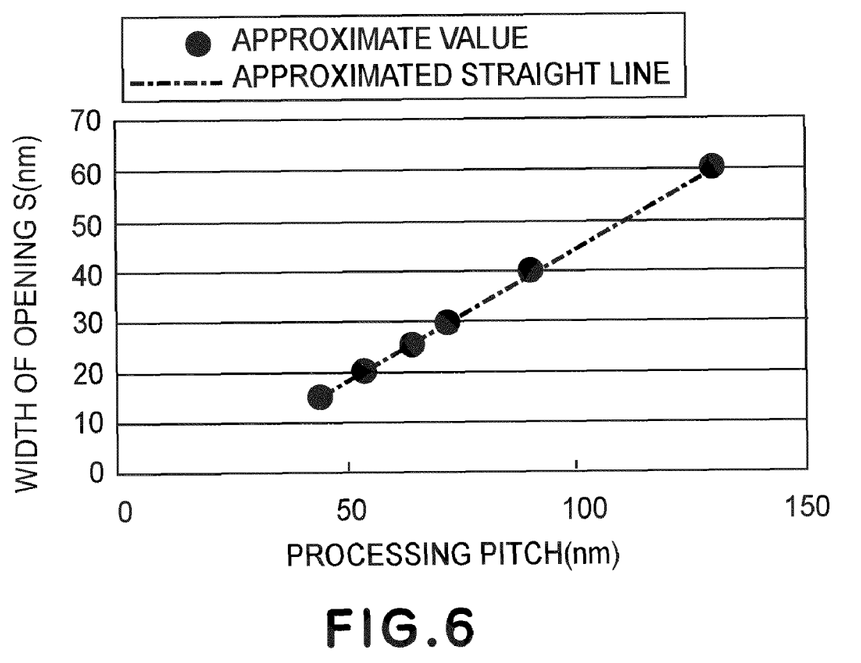
FIG. 6 is a graph for explaining the relationship between the width of the opening and the processing pitch that assures a largest near-field light intensity gradient.

FIG. 6 is a graph for explaining the relationship between the width of the opening and the processing pitch, with which a largest intensity gradient of the near-field light as provided by the FDTD method and plotted in FIG. 6, is obtainable. Specifically, in FIG. 6, the results obtained by the FDTD method have been plotted.

FIG. 6 shows the results obtained by the FDTD method, assuming that a desired processing pitch to the object 9 is p (nm) and the opening width of the micro-opening pattern 3, with which the intensity gradient of the near-field light at the boundary between the exposed portion and the unexposed portion becomes largest, is s (nm). It has been found that the processing pitch p and the opening width s provided by the FDTD method can be comparatively precisely approximated by a straight line, and that the relationship of them can be expressed by s=0.53p−8.3 as given in Equation (A) above.

It is to be noted that this relationship is independent from the thickness and material of the mask base member 1.

Figure 7:
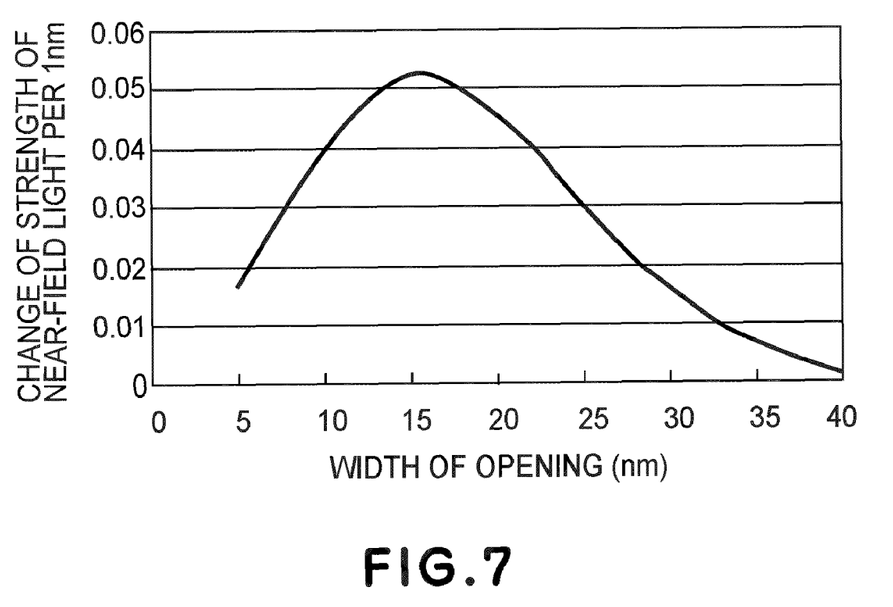
FIG. 7 is a graph for explaining the relationship between the width of the opening and the near-field light intensity gradient.

FIG. 7 illustrates the relationship between the width of the opening and the intensity gradient of the near-field light.

In FIG. 7, the displacement of the near-field light intensity per 1 nm in the X-direction, with respect to various opening widths, when the processing pitch is 44 nm, has been plotted.

In accordance with Equation (A) above, if the processing pitch is 44 nm, the intensity gradient of the near-field light becomes largest when the opening width is 15 nm. This corresponds to the maximum value of the displacement of the near-field light intensity shown in FIG. 7.

Furthermore, the maximum value of the near-field light intensity displacement per 1 nm in the X-direction is 0.052, such that, within the range of ±5 nm relative to an optimum opening width of 15 nm, a value not less than 0.04, which is 80% of the maximum of the near-field light intensity displacement per 1 nm in the X-direction, is obtainable.

With a value approximately 80% or more of the maximum of the near-field light intensity displacement, a 1:1 line-and-space pattern is obtainable, generally with good precision.

Here, the coefficient of the primary function is not limited to the segment −8.3 with the inclination of 0.53, as in Equation (A) above. The opening width may be determined so as to satisfy the following equation (1), with regard to the processing pitch p (nm) and the opening width s (nm).

$$s = ap - b \quad (1)$$

However, in order to obtain an intensity gradient corresponding to 80% or more of the maximum of the near-field light intensity displacement, the coefficients a and b should satisfy the following equations (2) and (3).

$$0.46 \leq a \leq 0.58 \quad (2)$$

$$3 \leq b \leq 13 \quad (3)$$

Next, details of the steps shown in FIG. 1, based on the relationship of the width of opening of the micro-opening pattern 3 of the photomask 4 and the processing pitch provided in accordance with that as described above, will be explained.

At step S1, when the processing pitch p (nm) of the object to be exposed is given, the opening width s (nm) of the micro-opening pattern 3 of the photomask 4 is obtained as s=0.53p−8.3.

Furthermore, at step S2, a photomask 4 to which the micro-opening pattern 3, having an opening width and a processing pitch as determined at step S1, is prepared.

Next, a method of manufacturing a membrane photomask in the present embodiment will be explained.

FIGS. 8A-8E are diagrams for explaining the membrane photomask manufacturing method of the present invention.

Figure 8A:
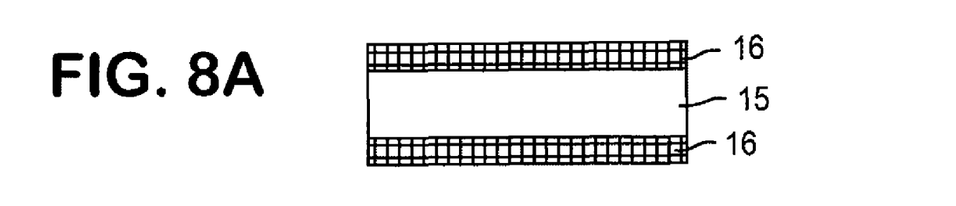
FIGS. 8A-8E are diagrams for explaining a method of manufacturing a membrane photomask in an embodiment of the present invention.

First of all, a silicon nitride film 16 is formed on both sides of a silicon substrate 15 with a thickness of around 400 nm (FIG. 8A).

Figure 8B:
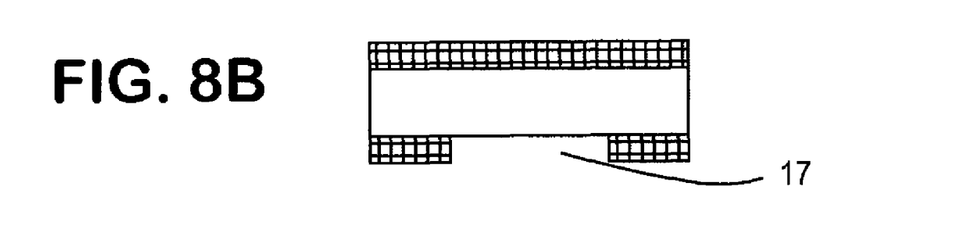

Subsequently, a back-etch hole 17 is formed on the back of the silicon substrate (FIG. 8B).

Figure 8C:
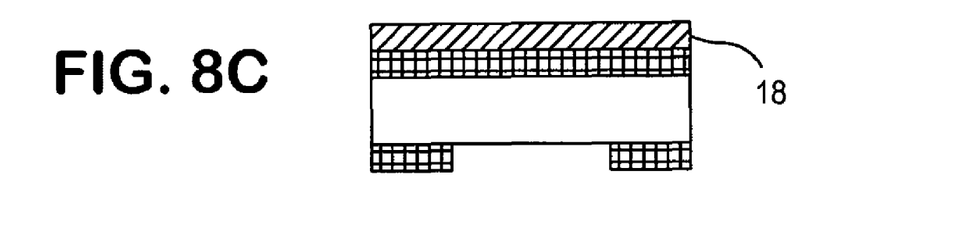
Figure 8D:
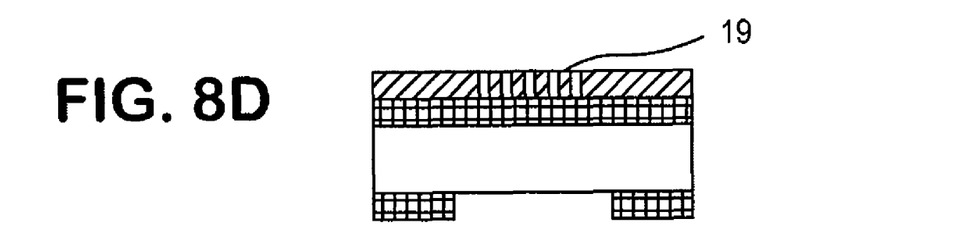

Then, an amorphous silicon film, which provides a light blocking film 18, is formed on the top surface of the substrate, with a thickness of around 50 nm (FIG. 8C). After this, a micro-opening pattern 19, having a processing pitch and an opening width determined at Step S1, is formed on the light blocking film 18, by use of an electron-beam lithography device, or the like (FIG. 8D).

Figure 8E:
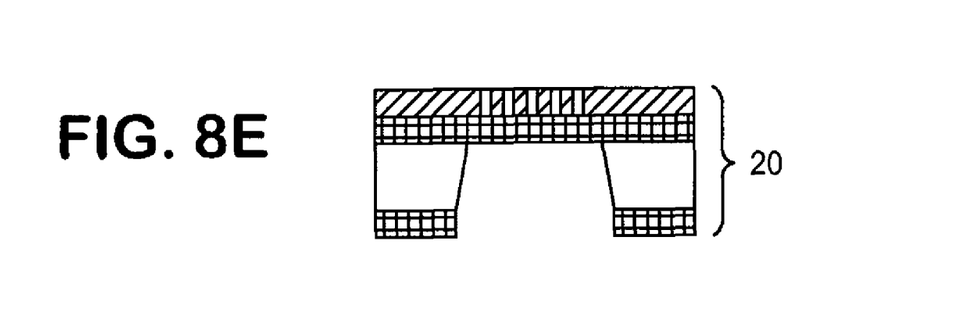

Subsequently, the silicon substrate 15 is removed from the back-etch hole 17 through an anisotropic wet-etching process using KOH. With this procedure, the region where the micro-opening pattern 19 is patterned is thinned into a film, whereby a membrane photomask 20 of a similar structure as that of the photomask 4 is obtained (FIG. 8E).

Next, with regard to Step S3, following step S2, a method of closely contacting the membrane photomask and the upper-layer resist layer will be explained.

Figure 9:
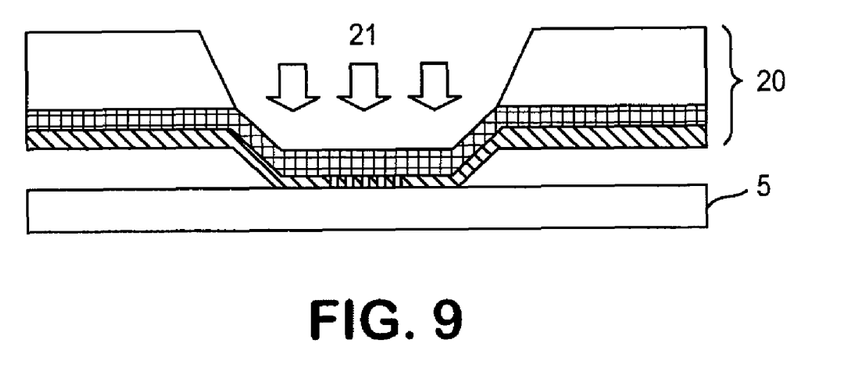
FIG. 9 is a diagram for explaining the state of close-contact exposure of a membrane photomask, and the object to be exposed, in an embodiment of the present invention.

FIG. 9 is a diagram for explaining the state of close-contact exposure of the membrance photomask and the object to be exposed.

At step S3, the membrane photomask 20, prepared at Step S2, and the upper-layer resist layer 5 of the object to be exposed 9, are closely contacted to each other. Specifically, the membrane photomask 20 is attached to a pressure container (not shown) and it is pressurized.

Due to the applied pressure 21, the patterned region of the membrane photomask 20 is thinned into a film and bent thereby, such that it is closely contacted to the upper-layer resist layer 5.

After the close contact, exposure light is projected to the membrane photomask 20. Thus, the upper-layer resist layer 5 of the object to be exposed 9 is exposed by near-field light produced adjacent to the micro-opening pattern 19.

The exposure process based on the near-field exposure method of the present embodiment is such as described above. However, the upper-layer resist layer 5 is almost around 10 nm in thickness, which is insufficient when the method is generally applied to industrial fields of LSI manufacture, and the like.

A pattern forming process to be made to the object to be exposed 9, after the exposure, to compensate for this, will be explained below.

A developing process is carried out to the upper-layer resist layer 5 after the near-field exposure. Here, if the upper-layer resist layer 5 is a positive type resist, the exposed portion will be removed by the development process. If it is a negative resist, the unexposed portion will be removed by the development process.

The present embodiment will be explained with regard to the positive type resist.

Figure 10A:
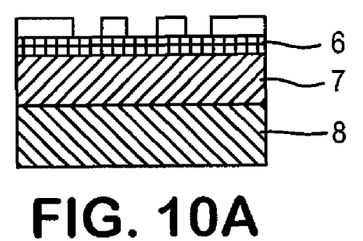
FIGS. 10A-10C are diagrams for explaining a method of forming a pattern on the object to be exposed, after the exposure.
Figure 10B:
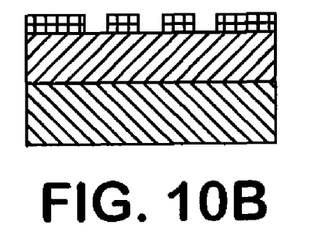
Figure 10C:
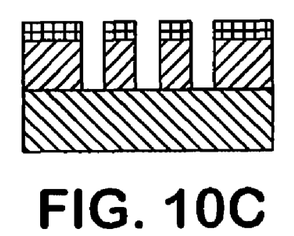

FIGS. 10A-10C are diagrams for explaining a method of forming a pattern on the object to be exposed, after the exposure.

FIGS. 10A-10C illustrate the process of transferring a high-aspect pattern.

The present embodiment includes a development process as a post-process after the process of exposing the object to be exposed. At this developing process, the upper-layer resist layer 5 at the exposed portion is removed (FIG. 10A).

Subsequently, a fluorine series gas is applied, while using the remaining upper-layer resist layer 5 as a mask, to etch the SOG layer 6, which is a backing layer formed as a backing for the upper-layer resist layer 5 (FIG. 10B). Thereafter, an oxygen series gas is applied, while the SOG layer 6 having been etched is used as a mask, to etch the lower-layer resist layer 7.

It is to be noted that the material of the lower-layer resist layer 7 is a phenol resin of a resin system, having a resistance to the fluorine series gas (FIG. 10C).

In order to apply the process of transferring a high-aspect pattern, such as shown in FIGS. 10A-10C, it is desirable that the object to be exposed has a laminated structure comprising at least three levels on the substrate, as shown in FIG. 3. With regard to the structure of the object 9 to be exposed, the upper-layer resist layer 5 should preferably have a thickness of 10 nm. However, Equation (A) still applies with the thickness range of 5 nm to 15 nm.

With regard to the thickness of SOG layer 6, since it has substantially no influence on the intensity or spatial distribution of the near-field light upon the upper-layer resist layer, it can be chosen from a wide range. However, a 20 nm thickness is desirable.

With regard to the thickness of the lower-layer resist layer 7, it is particularly preferable that the total thickness of the upper-layer resist layer 5, SOG layer 6 and lower-layer resist layer 7, namely, the thickness of the multi-layer resist layer, is 130 nm. However, it may be in a desirable range of 120 nm to 150 nm.

This is because of the following reasons.

The near-field light produced at the micro-opening pattern 3 of the photomask 4 is converted into propagating light, such that a progressive wave propagating in the upper-layer resist layer 5 and the SOG layer 6 is produced.

On the other hand, the progressive wave is reflected at the boundary between the substrate 8 and the lower-layer resist layer 7, by which a reflected wave is produced, which causes a standing wave in the multi-layer resist layer.

When the upper-layer resist layer 5 has a thickness of around 10 nm and the thickness of the multilayered resist layer is around 130 nm, a node of the standing wave is formed at the boundary between the upper-layer resist layer 5 and the SOG layer 6.

With this arrangement, the intensity of near-field light for exposing the upper-layer resist layer 5 is strengthened, as compared with a case in which the substrate 8 has a low reflectivity to the exposure light or the thickness of the upper-layer resist layer 5 or, alternatively, the thickness of the upper-layer resist layer 5, SOG layer 6 and the lower-layer resist 7 deviates largely from the above-mentioned range.

For this reason, the substrate 8 should preferably be made of a material having a high reflectivity to the exposure light and, in this embodiment, it is made of silicon.

The results, obtained by quantitatively investigating the near-field light intensity strengthening effect of the standing waves in the multilayered resist, will be described below.

Figure 11:
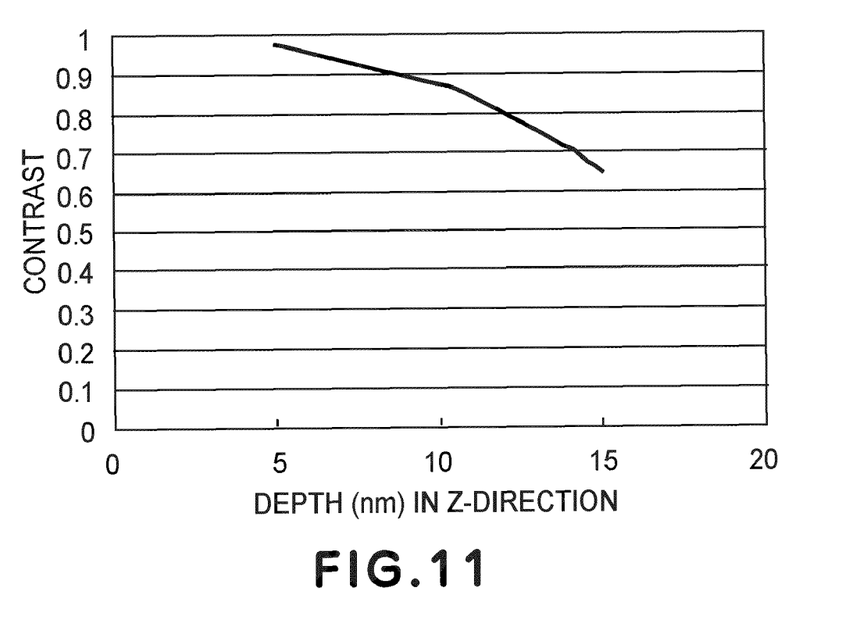
FIG. 11 is a graph for explaining the relationship between the Z-direction depth and the contrast.

FIG. 11 is a diagram for explaining the relationship between the Z-direction depth and the contrast.

FIG. 11 illustrates the change in contrast when the processing pitch is 44 nm, the opening width is 15 nm and the thickness of the upper-layer resist is 130 nm, while the position from the upper-layer resist layer surface in the negative Z direction in FIG. 5 is taken as the Z-direction depth.

Here, the contrast refers to the quantity that can be detected in accordance with Equation (4) below, wherein the maximum value of the near-field light intensity distribution in one section along the X-direction, at a certain position in the Z-direction, is denoted by $I_{max}$ while the minimum is denoted by $I_{min}$.

$$\text{Contrast} = (I_{max} - I_{min})/(I_{max} + I_{min}) \quad (4)$$

If the Z-direction depth is 15 nm or less, a contrast of 0.65 or more is obtainable. This is a sufficient condition for exposing the upper-layer resist layer.

In other words, the portion of the upper-layer resist layer up to a distance of 15 nm from the surface thereof can be exposed sufficiently.

Furthermore, in FIG. 11, the Z-direction depth should preferably be made as small as possible. However, since the lower limit of a resist layer coating that can be made by a spin coating method, or the like, is around 5 nm, practically, the thickness of the upper-layer resist layer 5 may be not less than 5 nm, and not greater than 15 nm.

Figure 12:
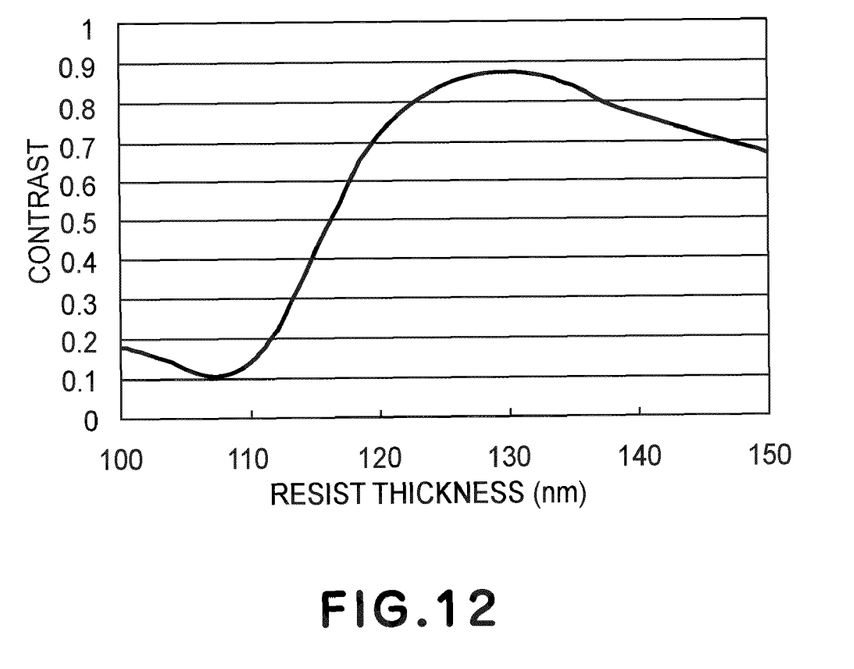
FIG. 12 is a graph for explaining the relationship between the resist layer thickness and the contrast.

FIG. 12 is a diagram for explaining the relationship between the resist layer thickness and the contrast. FIG. 12 illustrates the change in contrast and the thickness of the resist layer at the Z-direction depth of 10 nm, when the processing pitch is 44 nm and the opening width is 15 nm.

The thickness of the resist layer most suitable for the contrast is 130 nm. However, a thickness of the multilayer resist layer in a range of 120 nm to 150 nm is still preferable, since a contrast 0.65 or more, described above, is obtainable by that.

It is to be noted that a multilayer resist structure of the object 9 to be exposed is desirable only when deep processing is required, as in the LSI manufacture. If a processing depth may be 10 nm or less, the object to be exposed may have a structure comprising a single-layered resist layer and a substrate.

On that occasion, the thickness of the single-layered resist layer may most preferably be 130 nm, preferably, in a range of 120 nm to 150 nm. The substrate should preferably have a high reflectivity to the exposure light, such as silicon.

While the invention has been described with reference to the structures disclosed herein, it is not confined to the details set forth and this application is intended to cover such modifications or changes as may come within the purposes of the improvements, or the scope of the following claims.

What is claimed is:

1. A near-field exposure method wherein an exposure mask having a light blocking film with an opening smaller than a wavelength of light from an exposure light source is used and wherein an object to be exposed is exposed by near-field light produced at the opening of the exposure mask based on the exposure light from the exposure light source, the method comprising:

a step of determining a width of the opening so as to satisfy equations (1), (2) and (3) below, where the width of the opening of the exposure mask is denoted by s (nm), a processing pitch of the object to be exposed is denoted by p (nm) and coefficients are denoted by a and b, $$s = ap - b \tag{1}$$

$$0.46 \leq a \leq 0.58 \tag{2}$$

$$3 \leq b \leq 13 \tag{3}$$

a step of preparing the exposure mask having the opening with the width determined by said determining step in order to obtain a largest intensity gradient of the near-field light at a distance corresponding to ¼ of the processing pitch from the center of the opening; and a step of projecting the exposure light to the exposure mask to thereby expose the object to be exposed.

2. A method according to claim 1, wherein the object to be exposed has a structure comprised of a substrate having a high reflectivity to the exposure light and a resist layer, and wherein the resist layer has a thickness not less than 120 nm and not greater than 150 nm.

3. A method according to claim 2, wherein the resist layer has a multilayer resist structure comprised of at least an upper-layer resist layer and a lower-layer resist layer, and wherein the upper-layer resist layer has a thickness not less than 5 nm and not greater than 15 nm.

4. A method according to claim 3, further comprising a developing step as a post-process after said exposure light projecting step, wherein, after said developing step, while the upper-layer resist layer remaining there is used as a mask, a backing layer formed as a backing for the upper-layer resist layer is etched and, then, the lower-layer resist layer is etched while the etched backing layer is used as a mask.

* * * * *